US012772752B2

(12) United States Patent
Marozas et al.

(10) Patent No.: US 12,772,752 B2
(45) Date of Patent: Oct. 20, 2026

(54) METHOD FOR DEPOSITING PHOSPHORUS CONTAINING SILICON LAYER

(71) Applicant: ASM IP Holding B.V., Almere (NL)

(72) Inventors: Brendan Marozas, Leuven (BE); Rami Khazaka, Leuven (BE); Gregory Deye, Seattle, WA (US)

(73) Assignee: ASM IP Holding B.V., Almere (NL)

( * ) Notice: Subject to any disclaimer, the term of this patent is extended or adjusted under 35 U.S.C. 154(b) by 275 days.

(21) Appl. No.: 18/545,699

(22) Filed: Dec. 19, 2023

(65) Prior Publication Data

US 2024/0213022 A1 Jun. 27, 2024

Related U.S. Application Data

(60) Provisional application No. 63/476,468, filed on Dec. 21, 2022.

(51) Int. Cl.

| | |
|---|---|
| ***C30B 25/16*** | (2006.01) |
| ***C30B 25/20*** | (2006.01) |
| ***C30B 29/06*** | (2006.01) |
| ***H10P 14/20*** | (2026.01) |
| ***H10P 50/24*** | (2026.01) |

(52) U.S. Cl.

CPC ........ *H10P 14/3438* (2026.01); *C30B 25/165* (2013.01); *C30B 25/205* (2013.01); *C30B 29/06* (2013.01); *H10P 14/2905* (2026.01); *H10P 14/2926* (2026.01); *H10P 14/3411* (2026.01); *H10P 50/244* (2026.01)

(58) Field of Classification Search

CPC ..... C30B 29/06; C30B 25/162; C30B 25/205; H01L 21/0257; H01L 21/02381; H01L 21/02433; H01L 21/02532; H01L 21/30655

See application file for complete search history.

(56) References Cited

U.S. PATENT DOCUMENTS

| | | | | |
|---|---|---|---|---|
| 8,207,023 | B2 | 6/2012 | Ye | |
| 2006/0073679 | A1* | 4/2006 | Airaksinen ....... | H01L 21/02381 257/E21.106 |
| 2018/0230624 | A1* | 8/2018 | Dube .................. | C23C 16/0245 |
| 2020/0266068 | A1* | 8/2020 | Li ..................... | H01L 23/53209 |
| 2021/0254238 | A1 | 8/2021 | Khazaka | |
| 2022/0364262 | A1 | 11/2022 | Khazaka | |

OTHER PUBLICATIONS

Breakdown physics of low-temperature silicon epitaxy grown from silane radicals Charles W. Teplin, Eugene Iwaniczko, Bobby To, Helio Moutinho, Paul Stradins, and Howard M. Branz Phys. Rev. B 74, 235428—Published Dec. 15, 2006.

(Continued)

*Primary Examiner* — Robert M Kunemund

(74) *Attorney, Agent, or Firm* — Banner & Witcoff, Ltd.

(57) ABSTRACT

A method for epitaxially growing a phosphorus doped silicon layer on a substrate is disclosed. Embodiments of the presently described method comprise exposing a substrate to a silicon precursor and to a phosphorus precursor, wherein the exposure of the substrate to the phosphorus precursor is done during an overlapping period with the exposure to the silicon precursor.

19 Claims, 2 Drawing Sheets

(56) References Cited

OTHER PUBLICATIONS

Figure 1A:
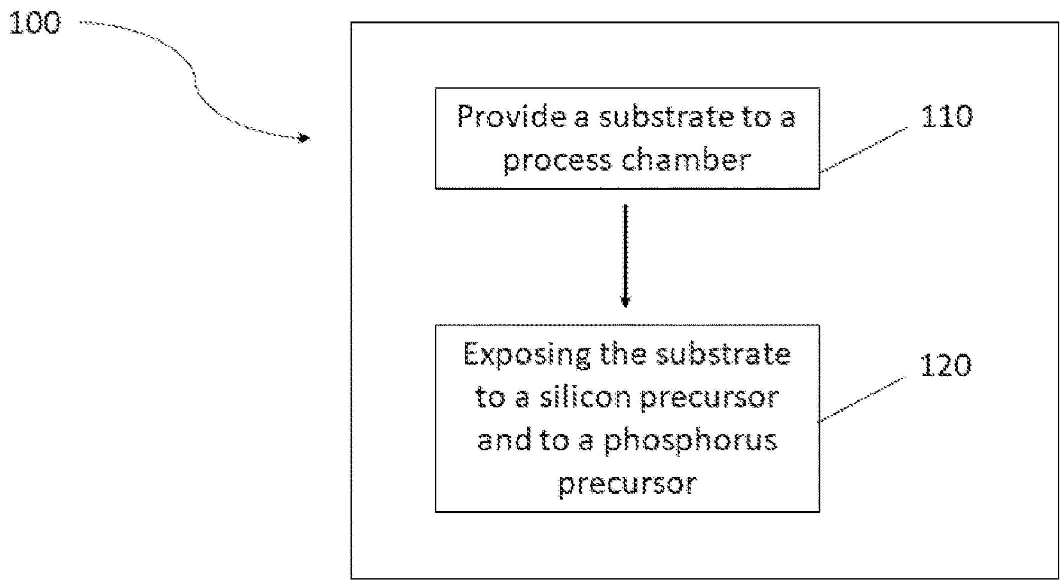

Dissociation and pyrolysis of Si2H6 on Si surfaces: The influence of surface structure and adlayer composition, Xia et al, J. Chem. Phys. 103, 1691-1701 (1995).
Formation, evolution and transition of multiple surface patterns in metal films on polymer substrates under uniaxial loading, Yu et al, Thin Solid Films vol. 669, Jan. 1, 2019, pp. 355-363.
G03-1188—(Digital Presentation) Properties of Selectively Grown Si:P Layers below 500° C. for Use in Stacked Nanosheet Devices.
Investigation of Growth Mechanism and Role of H2 in Very Low Temperature Si Epitaxy, Mosleh et al, ECS Transactions, 64 (6) 967-975 (2014), 10.1149/06406.0967ecst © The Electrochemical Society.
Kinetics and mechanics of Si2H6 surface decomposition on Si, Kulkarni et al , J. Vac. Sci. Technol. A 8, 2956-2959 (1990) https://doi.org/10.1116/1.576612.
Limiting thickness h epi for epitaxial growth and room-temperature Si growth on Si(100). D. J. Eaglesham, H.-J. Gossmann, and M. Cerullo, Phys. Rev. Lett. 65, 1227—Published Sep. 3, 1990.
Low-temperature epitaxial growth of Si by electron cyclotron resonance chemical vapor deposition, J. Platen et al, Thin Solid Films 381 (2001) 22]30, Elsevier.
Mechanisms of disilane decomposition on Si(111)-7×7, Kulkarni et al, Surface Science vol. 239, Issues 1-2, Dec. 1, 1990, pp. 26-35.
Role of hydrogen desorption in the chemical-vapor deposition of Si(100) epitaxial films using disilane, John J. Boland Phys. Rev. B 44, 1383(R)—Published Jul. 15, 1991.
Selective Epitaxial Growth (SEG) of Highly Doped Si:P on Source/Drain Areas of NMOS Devices Using Si H /PH /Cl Chemistry, Bauer et al, Citation Matthias Bauer and Shawn Thomas 2010 ECS Trans. 33 629 DOI 10.1149/1.3487593.
Synchrotron radiation assisted Si epitaxial growth: Comparison of growth characteristics between Si2H6 and SiH2Cl2 gases, T. Urisu et al, Applied Physics Letters 62, 2821 (1993); doi: 10.1063/1.109221.

* cited by examiner

METHOD FOR DEPOSITING PHOSPHORUS CONTAINING SILICON LAYER

CROSS-REFERENCE TO RELATED APPLICATION(S)

This Application claims the benefit of U.S. Provisional Application 63/476,468 filed on Dec. 21, 2022, the entire contents of which are incorporated herein by reference.

FIELD OF INVENTION

The present disclosure relates to a method of forming an epitaxial layer. More specifically, the disclosure relates to a method of forming a phosphorus doped silicon layer epitaxially on a substrate, a field effect transistor obtained thereof and a substrate processing apparatus for forming the phosphorus doped epitaxial silicon layer on the substrate.

BACKGROUND OF THE DISCLOSURE

With the progress in semiconductor industry, epitaxial growth of layers, particularly at lower process temperatures may become more critical. This may be due to the various novel integration schemes such as, for example, 3D stacking of devices, buried power rail (BPR) integration, formation of source/drain contact layers and high-k/metal gate first integration schemes.

The challenges introduced by low temperature epitaxial film growth may be related to defect formation and epitaxial breakdown of the layer that may result in amorphous material with poor electrical performance. Furthermore, low temperature epitaxy may pose challenges in terms of maintaining selectivity towards dielectric layers and in terms of achieving a high growth rate.

Therefore, there may be a need to provide methods capable of achieving the growth of monocrystalline epitaxial layers at lower process temperatures while overcoming the challenges.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

It may be an object of the present disclosure to provide an improved method for growing epitaxial layers at lower process temperatures.

In a first aspect, the present disclosure relates to a method for epitaxially growing a phosphorus doped silicon layer on a substrate, The method may comprise providing a substrate to a process chamber. The substrate may comprise a first surface. The first surface may be monocrystalline. The method may also comprise exposing the substrate to a silicon precursor and to a phosphorus precursor, thereby epitaxially growing the phosphorus doped silicon layer on the monocrystalline surface. The phosphorus precursor may comprise a phosphorus halide. The exposure of the substrate to the phosphorus precursor may be done during an overlapping period with the exposure to the silicon precursor.

The method according to embodiments of the first aspect of the present disclosure may advantageously lead to the growth of epitaxial layer at lower process temperatures. Particularly, it may be an advantage to grow phosphorus doped silicon epitaxial layers at lower process temperatures. This may particularly be advantageous for process temperatures lower than 600° C. and particularly lower than 500° C.

It may also be an advantage that incorporation of active dopant in the epitaxial layer may be increased. This may further allow for reduction in the resistivity of the epitaxial layer. This may particularly lead to a reduction in contact resistance when the epitaxial layer is forms the source/drain of a field effect transistor.

It may be an advantage that crystallinity of the epitaxial layer may be improved.

It may further be an advantage that selectivity of epitaxial layer growth at low temperature with respect to non-monocrystalline surfaces may be improved. This may be advantageous for process temperatures lower than 600° C. and particularly lower than 500° C.

It may further be an advantage that the phosphorus doped silicon epitaxial layer remains fully crystalline on all crystal facets of a silicon substrate.

It may also be an advantage that high growth rate of the epitaxial layer may be maintained at lower process temperatures, lower than 600° C. and particularly lower than 500° C. This may further provide the advantage of maintaining a high process throughput at lower process temperatures.

It may be an advantage that selective epitaxial growth of phosphorus doped silicon layer may be achieved. It may further be advantageous that selective epitaxial growth of phosphorus doped silicon layer may be achieved at lower process temperatures, lower than 600° C. and particularly lower than 500° C.

In a second aspect, the present disclosure relates to a field effect transistor. The field effect transistor may comprise a source/drain region. The source/drain region may comprise a phosphorus doped silicon layer that may be grown according to embodiments of the first aspect of the present disclosure. The field effect transistor may comprise a fin, a nanosheet or a nanowire.

The field effect transistor according to embodiments of the second aspect of the present disclosure may be advantageous in terms of having a layer with a high active dopant concentration in the source/drain regions.

It may thus, provide an advantage of being a transistor with a high performance.

It may further be an advantage that the transistor may allow for a reduced contact resistance.

Furthermore, it may also be an advantage of having a source/drain region with a reduced parasitic resistance thanks to the reduced contact resistance, where the parasitic resistance may include the contact resistance between the metal contact and the source/drain regions of the transistor.

In a third aspect the present disclosure relates to a substrate processing apparatus. The substrate processing apparatus may comprise at least one process chamber and a controller configured to enable the substrate processing apparatus to perform a method according to embodiments of the first aspect of the present disclosure.

The substrate processing apparatus according to embodiments of the third aspect of the present disclosure may allow for epitaxial growth of a phosphorus doped silicon epitaxial layer selectively on a substrate at lower process temperatures.

It may further be an advantage that the substrate processing apparatus may provide for epitaxial growth at lower process temperatures while maintaining a high growth rate, thereby helping to improve process throughput and overall semiconductor manufacturing throughput.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

Like reference numbers will be used for like elements in the drawings unless stated otherwise. Reference signs in the claims shall not be understood as limiting the scope.

Figure 1B:
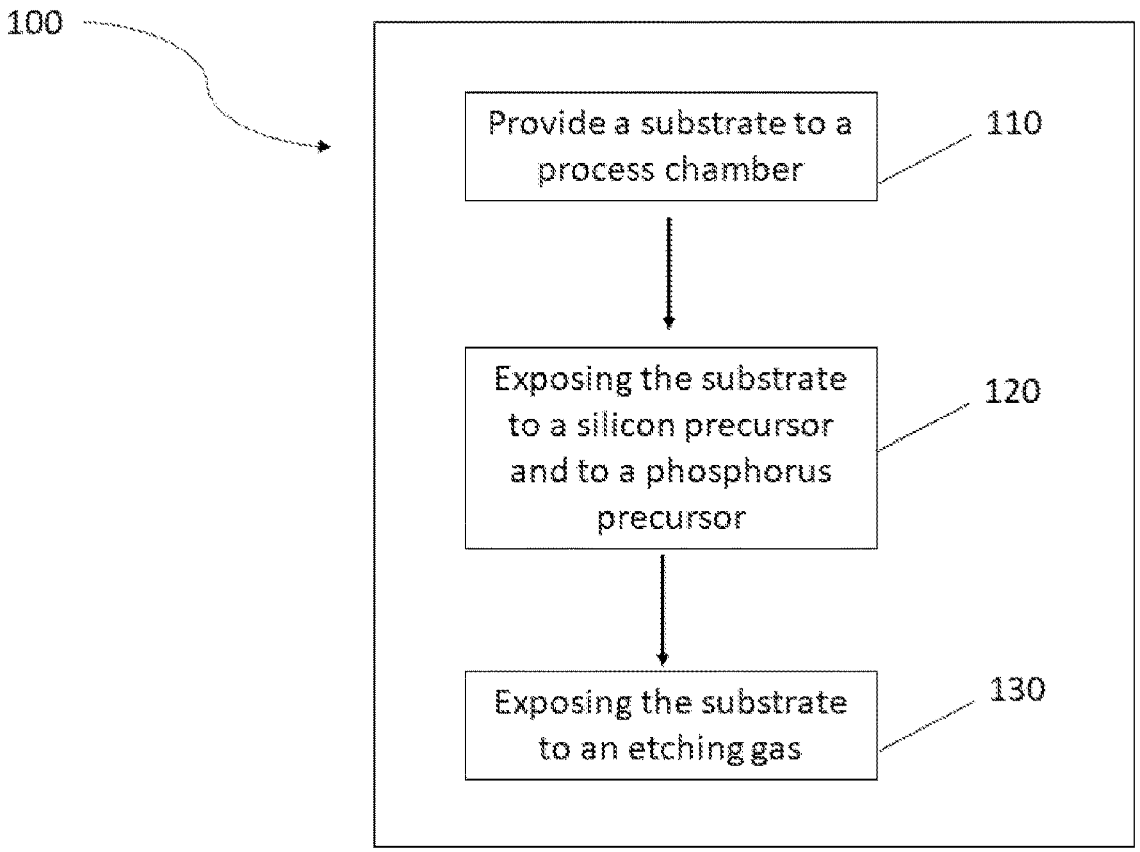
Figure 1C:
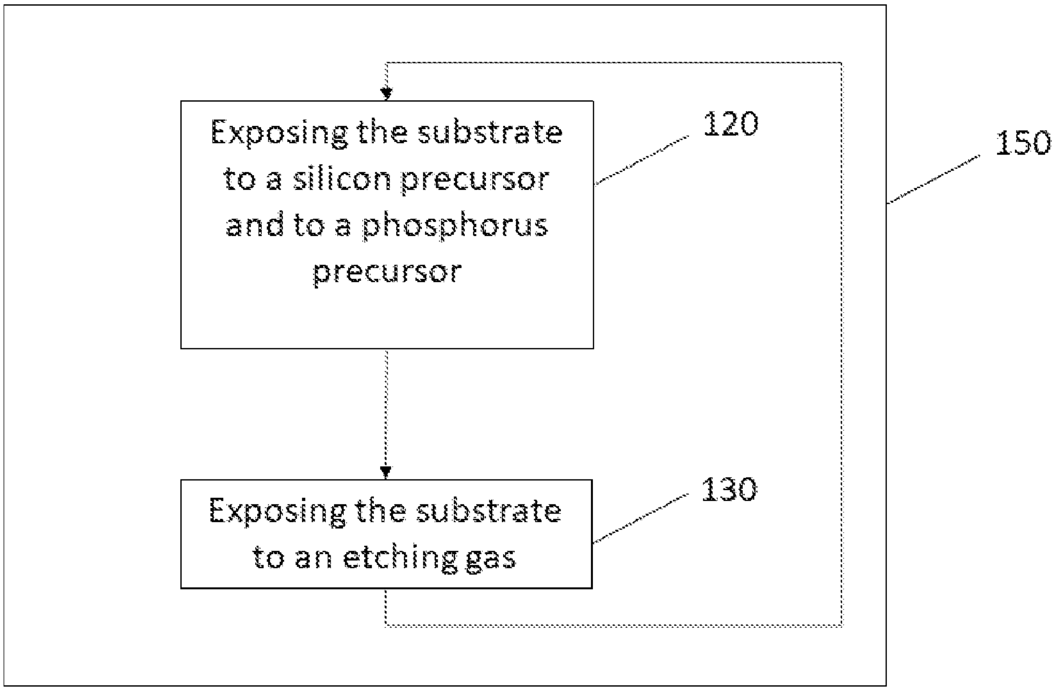

FIGS. 1*a*-1*c*: Flowchart of an exemplary method according to embodiments of the first aspect of the present disclosure.

Figure 2:
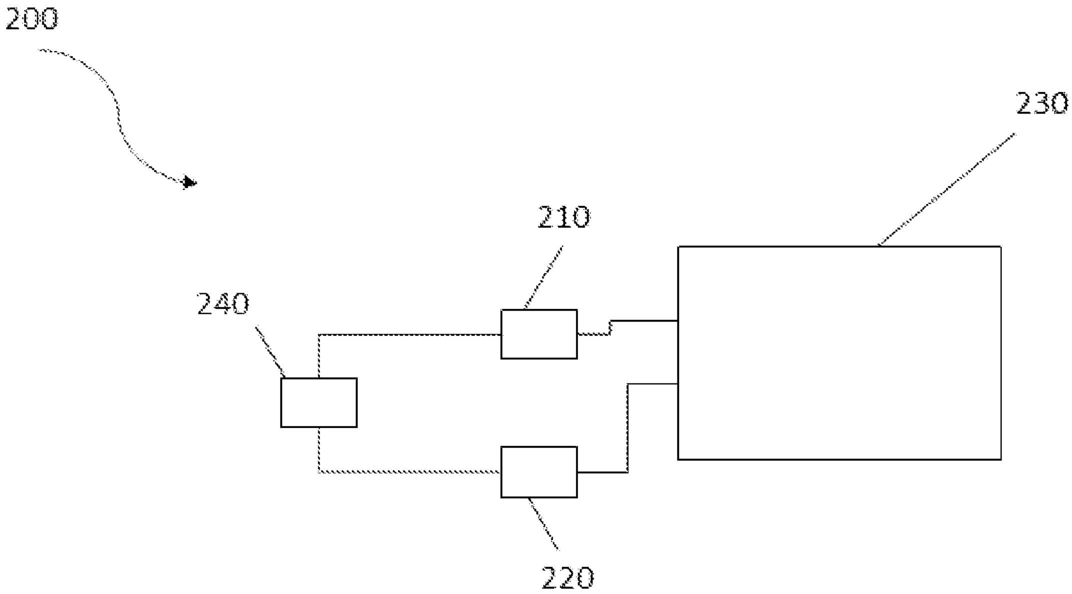

FIG. 2: A schematic representation of a substrate processing apparatus according to embodiments of the second aspect of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term “substrate” may refer to any underlying material or materials, including any underlying material or materials that may be modified, or upon which, a device, a circuit, or a film may be formed. The “substrate” may be continuous or non-continuous; rigid or flexible; solid or porous; and combinations thereof. The substrate may be in any form, such as, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub-combinations of the various processes, systems, and configurations, and other features, functions, acts, and/or properties disclosed herein, as well as any and all equivalents thereof.

It is to be noticed that the term “comprising”, as used herein, should not be interpreted as being restricted to the means listed thereafter. It does not exclude other elements or steps. It is thus, to be interpreted as specifying the presence of the stated features, steps or components as referred to. However, it does not prevent one or more other steps, components, or features, or groups thereof from being present or being added.

It is to be noticed that the term “comprise substantially” used in the claims refers that further components than those specifically mentioned can, but not necessarily have to, be present, namely those not materially affecting the essential characteristics of the material, compound, or composition referred to.

Reference throughout the specification to “embodiments” or “one embodiment” or “an embodiment” means that a particular structure, feature step described in connection with the embodiment is included in at least one embodiment of the present disclosure. Thus, phrases appearing such as “in an embodiment” or “in one embodiment” in different places throughout the specification are not necessarily all referring to the same embodiment, but may. Furthermore, the particular features, structures or characteristics maybe combined in any suitable manner, as would be apparent to one of the ordinary skill in the art from the disclosure, in one or more embodiments.

Reference throughout the specification to “some embodiments” means that a particular structure, feature, step described in connection with these embodiments is included in some of the embodiments of the present invention. Thus, phrases appearing such as “in some embodiments” in different places throughout the specification are not necessarily referring to the same collection of embodiments, but may.

Furthermore, the terms first, second, third, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

The following terms are provided only to help in the understanding of the disclosure.

As used herein and unless provided otherwise, the term "process throughput" may refer to the number substrates processed in a semiconductor processing apparatus in a given period.

As used herein and unless provided otherwise, the term "fully crystalline" may refer to the fact that the thickness of the epitaxial layer maintains its monocrystalline structure throughout its thickness.

The disclosure will now be described by a detailed description of several embodiments of the disclosure. It is clear that other embodiments of the disclosure can be configured according to the knowledge of persons skilled in the art in the absence of departure from the technical teaching of the disclosure. The disclosure is limited only by the terms of the claims included herein.

FIG. 1*a* represents a flowchart of an exemplary method according to embodiments of the first aspect of the present disclosure.

Described herein is a method (100) for epitaxially growing a phosphorus doped silicon layer on a substrate.

The method (100) may comprise providing (110) a substrate to a process chamber. The substrate may comprise a first surface. The first surface may be monocrystalline.

In some embodiments, the process chamber may be a single process chamber that may be comprised in a semiconductor processing apparatus. In some embodiments, the process chamber may be one of at least two process chambers that may be comprised in a semiconductor processing apparatus. The method according to embodiments of the first aspect is run in a single chamber; however, the same method may be run simultaneously in more than one process chamber of the semiconductor processing apparatus.

The method (100) may also comprise exposing (120) the substrate to a silicon precursor and to a phosphorus precursor. This may allow for growing epitaxially the phosphorus doped silicon layer on the monocrystalline surface. The exposure of the substrate to the phosphorus precursor may be done during an overlapping period with the exposure to the silicon precursor. The phosphorus precursor may comprise a phosphorus halide.

The disclosed method according to embodiments of the first aspect of the disclosure may allow for improving crystallinity of the epitaxial phosphorus doped silicon layer formed. Furthermore, it may provide the advantage of facilitating the epitaxial phosphorus doped silicon layer growth at a lower process temperature.

In embodiments, the monocrystalline surface may comprise a monocrystalline silicon surface.

In embodiments, the monocrystalline silicon surface may comprise at least one of a first monocrystalline silicon surface and a second monocrystalline silicon surface. The second monocrystalline silicon surface may be different than the first monocrystalline surface. This may enable the growth of the phosphorus doped epitaxial silicon layer on monocrystalline silicon surfaces having either of the two monocrystalline silicon surface. It may also enable growing the phosphorus doped epitaxial silicon layer independent of the crystal orientation of the silicon surface when the monocrystalline silicon surface comprises both of the first and the second monocrystalline silicon surface. This may provide the advantage of growing the phosphorus doped epitaxial silicon layer continuously on the silicon surface that may comprise silicon surfaces having different crystal orientations. In semiconductor manufacturing, this may prove to be advantageous when growing such as, for example, source/drain regions of field effect transistors (FETs) comprising fins, nanosheets, nanowires, such as for example in fin-type field effect transistor (FinFET), complementary field effect transistor (CFET), gate-all-around field effect transistor (GAA-FET) or nanosheet FET.

In some embodiments, the first monocrystalline silicon surface may comprise a Si {100} crystal facet and the second monocrystalline silicon surface may comprise a high order silicon crystal facet.

In some embodiments, the first monocrystalline silicon surface may consist of a Si {100} crystal facet and the second monocrystalline silicon surface may consist of a high order silicon crystal facet.

The high order silicon facet may, in some embodiments, be a Si {110} crystal facet or a Si {111} facet.

In embodiments, the exposure of the substrate to the silicon precursor and to the phosphorus precursor may overlap at a value up to 100%. This may infer that a total time of exposure of the substrate to the phosphorus precursor may be at a value of up to 100% overlapping with a total time of exposure of the substrate to the silicon precursor.

In some embodiments, the substrate may be exposed to the phosphorus precursor while it is being exposed to the silicon precursor. Thus, the exposure of the substrate to the phosphorus precursor may be done substantially simultaneously with the exposure to the silicon precursor. In other words, there may be a 100% overlap of the two exposures with each other. Thus, the phosphorus precursor may be co-flown with the silicon precursor into the process chamber.

In embodiments, the silicon precursor may comprise a high order silicon precursor.

In embodiments, high order silicon precursor may be represented by $Si_nH_{2n+2}$, where n is equal to at least 2.

In embodiments, the high order silicon precursor may thus, be such as, for example, $Si_2H_6$, $Si_3H_8$ and $Si_4H_{10}$. High order silicon precursor may provide the advantage of enabling epitaxial film growth at lower process temperatures as disclosed in the present disclosure. Furthermore, high order silicon precursor may also allow for maintaining a high growth rate of the epitaxial layer at lower temperatures as disclosed in the present disclosure. This may thus, be advantageous for not only enabling low temperature epitaxy, but also reduces the compromise from process throughput at lower temperatures.

In some embodiments, the silicon precursor may be a mixture of high order silicon precursor. In other words, more than one high order silicon precursor may be co-flown into the process chamber.

In embodiments, the flow rate of $Si_2H_6$ may be in a range of 50 sccm to 700 sccm. In some embodiments, the flow rate of $Si_2H_6$ may be in a range of 100 sccm to 600 sccm. In some embodiments, the flow rate of $Si_2H_6$ may be in a range of from at least 100 sccm to at most 200 sccm, or from at least 200 sccm to at most 300 sccm, or from at least 300 sccm to at most 400 sccm, or from at least 400 sccm to at most 500 sccm, or from at least 500 sccm to at most 600 sccm.

$Si_3H_8$ is in liquid form and the temperature of the vessel holding $Si_3H_8$ may vary in a range of 10° C. to 50° C. In some embodiments, the temperature of the vessel may be set to 18° C. The flow rate of $Si_3H_8$ may be in a range of 20 mg/min to 300 mg/min. In some embodiments, the flow rate may be in a range of 50 mg/min. to 200 mg/min.

In embodiments, the silicon precursor may comprise a chlorosilane.

The chlorosilane precursor may provide the advantage of enhancing selective growth.

The chlorosilane may, some in embodiments, be monochlorosilane, dichlorosilane, trichlorosilane, tetrachlorosilane, octachlorotrisilane or hexachlorodisilane.

In embodiments, the silicon precursor may be provided to the process chamber in the presence of a carrier gas.

In embodiments, a temperature of the process chamber may be at most 600° C. during the exposure of the substrate to the silicon precursor and to the phosphorus precursor. Facilitating epitaxial layer growth at process temperatures lower than 600° C. may be advantageous in increasing active dopant incorporation in the epitaxial layer. Resistivity of the layer formed may, thus, be reduced thanks to the increased active dopant concentration. This may further be advantageous for enabling novel integration schemes in semiconductor device manufacturing such as for example, 3D integration of devices, buried power rail implementation or source/drain engineering. Particularly for source/drain engineering, lower temperature epitaxy may advantageously lead to a reduction in contact resistivity.

In some embodiments, the process temperature may be measured via a pyrometer. The pyrometer may be suspended in the process chamber above the substrate.

In some embodiments, the process temperature may be measured by using a thermocouple positioned beneath a support, such as for example a susceptor, that supports the substrate in the process chamber during the process. It is to be noted that the substrate temperature measured by the pyrometer suspended above the substrate in the process chamber and that measured using a thermocouple may differ from each other, particularly at low process temperatures, such as for example, lower than 600° C. and particularly lower than 500° C.

In embodiments, the process temperature may be in a range of from at least 350° C. to at most 600° C. This may, particularly, be advantageous when the silicon precursor is a high order silane or a high order chlorosilane.

In some embodiments, the silicon precursor may comprise the high order silane precursor and the chlorosilane. In other words, the chlorosilane may be co-flown with the high order silane. This may be advantageous within the process temperature disclosed in the present disclosure. The chlorosilane may then be chosen from monochlorosilane, dichlorosilane, trichlorosilane or tetrachlorosilane.

It is to be noted that as the process temperature approaches 600° C. or even exceeds 600° C., the silicon precursor may comprise substantially the chlorosilane.

In embodiments, the process pressure may be in a range between 5 Torr to 80 Torr.

In some embodiments, the process pressure may be in a range of from 20 Torr to 60 Torr.

In embodiments, the phosphorus halide may comprise a phosphorus chloride.

In some embodiments, the phosphorus halide may be a phosphorus chloride with a formula $PX_n$, with n being 3 or 5 and X being a halogen.

In some embodiments, the phosphorus halide may be a phosphorus chloride with a formula $P_mX_{2m}$ with m being 2 and with X being a halogen.

In some embodiments, the phosphorus chloride may be phosphorus trichloride ($PCl_3$). Phosphorus trichloride may provide the advantage of improving the crystallinity of the epitaxial layer grown. Improvement of crystallinity may particularly be advantageous at lower process temperatures such as, for example, lower than 600° C. and particularly lower than 500° C. Furthermore, it may be an advantage of co-flowing $PCl_3$ together with the silicon precursor that the critical thickness of the layer grown on Si {110} crystal facet may be increased. Increase in critical thickness may enable depositing a thicker epitaxial layer on Si {110} crystal facet before monocrystalline structure starts to loose periodicity. In other words, critical thickness may refer to the thickness beyond which, the monocrystalline epitaxial layer becomes amorphous. This may allow for depositing phosphorus doped silicon epitaxial layer on complex semiconductor device structures comprising fins, nanosheets or nanowires.

$PCl_3$ is in liquid form and the temperature of the vessel holding $PCl_3$ may be at a temperature in arrange of 0° C. to 50° C. Typically, the vessel temperature is between 5° C. to 40° C.

In embodiments, the flow rate of $PCl_3$ may be in a range of 10 sccm to 500 sccm. In some embodiments, the flow rate may be in a range of 20 sccm to 200 sccm.

In embodiments, the substrate may further comprise a second surface. The second surface may be different than the first surface. The phosphorus doped silicon epitaxial layer may thus, be grown epitaxially and selectively on the first surface relative to the second surface. Phosphorus trichloride may thus, provide the advantage of enhancing growth selectivity of the epitaxial layer on the first surface. Furthermore, co-flowing of phosphorus trichloride with the silicon precursor into the process chamber may advantageously allow for improving selectivity at lower process temperatures such as, for example, lower than 600° C. and particularly lower than 500° C.

In some embodiments, the second surface may be different than the first surface such that it may also be a monocrystalline surface, however; with a different composition.

In embodiments, at least one of the first surface and the second surface may comprise a semiconductor material. The semiconductor material may be a Group IV material.

In some embodiments, the second surface may be different than the first surface such that it may be non-monocrystalline. The non-monocrystalline surface may be a polycrystalline surface or an amorphous surface.

In some embodiments, the non-monocrystalline surface may be a dielectric surface. The dielectric surface may comprise an oxide, a nitride, an oxynitride, an oxycarbide or an oxycarbonitride. In some embodiments, the oxide, the nitride, the oxynitride, the oxycarbide or the oxycarbonitride may comprise silicon.

The selectivity of the formation of the phosphorus doped epitaxial silicon layer may change depending on the difference in the chemical behavior of the silicon precursor with respect to the first surface and the second surface. This may lead to a difference in growth rate of the phosphorus doped epitaxial silicon layer as a function of the difference in crystal orientation. Nucleation delay during the growth of the epitaxial layer may play a role, thereby retarding the growth on the second surface. It is thus, to be noted that in some embodiments, there may also be formation of the phosphorus doped epitaxial silicon layer on the second surface. This may be represented by a selectivity value of lower than or equal to 1 with regarding the formation of the phosphorus doped epitaxial silicon layer on the first surface compared to its formation on the second surface.

We now return to FIG. 1*b* showing a flowchart of an exemplary method according to embodiments of the first aspect of the present disclosure.

In embodiments, the method (100) may further comprise exposing the substrate to an etching gas (130). This may allow for improving selectivity of phosphorus doped epitaxial silicon layer growth on the first surface relative to the second surface. The exposure of the substrate to the etching gas may remove the phosphorus doped epitaxial silicon layer that may be grown on the second surface. This removal may thus, allow for achieving a selectivity value of higher than one regarding the formation of the phosphorus doped epitaxial silicon layer on the first surface compared to its formation on the second surface.

In some embodiments, the exposure of the substrate to the etching gas (130) may be performed alternatingly and repeatedly with the exposure of the substrate to the silicon precursor and to the phosphorus precursor (120) as schematically represented in FIG. 1*c*. This may then be referred to as a Cyclic Deposition and Etch (CDE) scheme (150). CDE scheme may help to achieve a full crystalline and a selective growth process of the phosphorus doped epitaxial silicon layer.

Thus, in some embodiments, exposing the substrate to the etching gas (130) may remove the phosphorus doped epitaxial silicon layer from the non-monocrystalline surface when the second surface is non-monocrystalline. In some embodiments, the exposure of the substrate (130) to the etching gas may remove the phosphorus doped epitaxial silicon layer from a monocrystalline surface when the second surface is monocrystalline with a composition different than that of the first surface.

In embodiments, the etching gas may comprise a halogen. In some embodiments, the etching gas may comprise chlorine gas. In some embodiments, the etching gas may substantially comprise chlorine gas.

In embodiments, the etching gas may be provided to the process chamber in the presence of a carrier gas.

In embodiments, the carrier gas may comprise $N_2$, and noble gases such as for example, Ar, Ne, He, Xe and Kr.

In some embodiments, the carrier gas may substantially comprise $N_2$, Ar, He, or combinations thereof.

In embodiments, the exposure of the substrate to the etching gas (130) may be done while maintaining the process temperature and process pressure used when exposing (120) the substrate to the silicon precursor and to the phosphorus precursor.

In embodiments, the flow rate of the chlorine gas may be in a range of 10 sccm to 200 sccm.

In embodiments, the flow rate of the chlorine gas may be in a range of from at least 10 sccm to at most 20 sccm, or from at least 20 sccm to at most 40 sccm, or from at least 40 sccm to at most 60 sccm, or from at least 60 sccm to at most 80 sccm, or from at least 80 sccm to at most 100 sccm, or from at least 100 sccm to at most 120 sccm, or from at least 120 sccm to at most 140 sccm, or from at least 140 sccm to at most 160 sccm, or from at least 160 sccm to at most 180 sccm, or from at least 180 sccm to at most 200 sccm.

In embodiments, the phosphorus precursor may further comprise phosphine. This may allow for increasing the phosphorus dopant concentration in the phosphorus doped silicon epitaxial layer formed. Increase in dopant concentration may help to reduce the resistivity of the epitaxial layer. This may further be advantageous when the phosphorus doped silicon epitaxial layer is used for source/drain regions of an n-type metal oxide semiconductor device.

In embodiments, the flow rate of phosphine may be in a range of 50 sccm to 900 sccm. In some embodiments, the flow rate may be in a range of 200 sccm to 600 sccm. In some embodiments, it may be in a range from at least 200 sccm to at most 300 sccm, or from at least 300 sccm to at most 400 sccm, or from at least 400 sccm to at most 500 sccm, or from at least 500 sccm to at most 600 sccm.

In embodiments, phosphine may be co-flown with the phosphorus halide. Thus, in some embodiments, phosphine may be co-flown with $PCl_3$.

In an embodiment, the method may comprise exposing the substrate to $Si_2H_6$ precursor while co-flowing $PCl_3$ and $PH_3$ thereby, growing epitaxially the phosphorus doped silicon layer. The method may further comprise exposing the substrate to $Cl_2$ gas, being the etching gas, in the presence of $N_2$, being the carrier gas.

Further described herein is a field effect transistor (FET). The field effect transistor may comprise a source/drain region. The source/drain region may comprise a phosphorus doped silicon epitaxial layer that may be grown by the method described herein according to embodiments of the first aspect of the present disclosure. The field effect transistor may comprise a fin, a nanosheet or a nanowire. The fin, the nanosheet or the nanowire may act as the gate of the field effect transistor. Thus, the field effect transistor may be a fin FET, nanosheet FET or a gate-all-around (GAA) FET.

We now return to FIG. 2 representing schematically a substrate processing apparatus (200) according to embodiments of the second aspect of the present disclosure Thus, further described herein, is a substrate processing apparatus (200). The substrate processing apparatus (200) may comprise at least one process chamber (230). The apparatus may also comprise a controller (240). The controller (240) may be configured to enable the substrate processing apparatus (200) to perform a method according to embodiments of the first aspect of this disclosure.

The semiconductor processing apparatus may further comprise a silicon precursor storage module (210) and a phosphorus precursor storage module (220). The silicon precursor storage module (210) may comprise a high order silicon precursor. It (210) may further comprise a chlorosilane. The phosphorus precursor storage module (220) may comprise at least one of a phosphorus halide precursor and phosphine.

In embodiments, the high order silicon precursor may be at least one of $Si_2H_6$, $Si_3H_8$ and $Si_4H_{10}$.

In some embodiments, the silicon precursor may be a mixture of high order silicon precursor. In other words, more than one high order silicon precursor may be co-flown into the process chamber.

In embodiments, the chlorosilane may be monochlorosilane, dichlorosilane, trichlorosilane, tetrachlorosilane, octachlorotrisilane or hexachlorodisilane.

The apparatus (200) may further comprise a heater (not shown in the figure) that may be configured to heat and maintain a process temperature in the process chamber (230). A pressure controller (not shown in the figure) may be further be comprised in the apparatus (200). The pressure controller may be configured to reach to the process pressure in the process chamber (230) and to main the process pressure.

The controller (240) may be operably connected to the silicon precursor storage module (210) and to the phosphorus precursor storage module (220). The controller (240) may be configured to execute instructions that may be stored in a non-transitory computer readable medium.

In some embodiments, the controller may be configured to include a processor for executing instructions that may be stored in the non-transitory computer readable medium.

The semiconductor apparatus (200) may advantageously allow for enabling epitaxial growth of a phosphorus doped silicon epitaxial layer at lower process temperatures, whereby the risk of decrease in process throughput may be reduced.

The embodiments of the present disclosure do not limit the scope of invention as these embodiments are defined by the claims appended herein and their legal equivalents. Any equivalent embodiments are intended to be within the scope of this invention. Modifications of the disclosure that are different from one another, in addition to those disclosed herein, may become apparent to those skilled in the art. Such modifications and the embodiments originating therefrom, are also intended to fall within the scope of the claims appended herein.

The invention claimed is:

1. A method for epitaxially growing a phosphorus doped silicon layer on a substrate, the method comprising:

providing a substrate to a process chamber, the substrate comprising a first surface, the first surface being monocrystalline, exposing the substrate to a silicon precursor and to a phosphorus precursor, thereby epitaxially growing the phosphorus doped silicon layer on the first surface, wherein the phosphorus precursor comprises both a phosphorus halide and phosphine, and wherein the exposure of the substrate to the phosphorus precursor is done during an overlapping period with the exposure to the silicon precursor.

2. The method according to claim 1, wherein the phosphorus halide is a phosphorus chloride.

3. The method according to claim 2, wherein the phosphorus chloride is phosphorus trichloride.

4. The method according to claim 1, wherein a temperature of the process chamber is at most 600° C. during the exposure of the substrate to the silicon precursor and to the phosphorus precursor.

5. The method according to claim 1, wherein the substrate further comprises a second surface, wherein the phosphorus doped silicon layer is grown epitaxially and selectively on the first surface relative to the second surface, and wherein the second surface is different than the first surface.

6. The method according to claim 5, wherein the second surface is non-monocrystalline.

7. The method according to claim 6, wherein the second surface is a dielectric surface.

8. The method according to claim 1, wherein the first surface comprises a monocrystalline silicon surface.

9. The method according to claim 8, wherein the monocrystalline silicon surface comprises at least one of a first monocrystalline silicon surface and a second monocrystalline silicon surface, the second monocrystalline silicon surface being different than the first monocrystalline silicon surface.

10. The method according to claim 9, wherein the first monocrystalline silicon surface consists of a Si {100} crystal facet and the second monocrystalline silicon surface consists of a high order silicon crystal facet.

11. The method according to claim 10, wherein the high order silicon crystal facet is Si {110} crystal facet or a Si {111} facet.

12. The method according to claim 5, wherein the method further comprises exposing the substrate to an etching gas, thereby improving selectivity of phosphorus doped epitaxial silicon layer growth on the first surface relative to the second surface.

13. The method according to claim 12, wherein the exposure of the substrate to the etching gas is performed alternatingly and repeatedly with the exposure of the substrate to the silicon precursor and to the phosphorus precursor.

14. The method according to claim 1, wherein the silicon precursor comprises a high order silicon precursor.

15. The method according to claim 14, wherein the high order silicon precursor is $Si_nH_{2n+2}$, wherein n is equal to at least 2.

16. The method according to claim 14, wherein the silicon precursor comprises a chlorosilane.

17. The method according to claim 16, wherein the chlorosilane is monochlorosilane, dichlorosilane, trichlorosilane, tetrachlorosilane, octachlorotrisilane or hexachlorodisilane.

18. A method for epitaxially growing a phosphorus doped silicon layer on a substrate, the method comprising:

providing a substrate to a process chamber, the substrate comprising a first surface, the first surface being monocrystalline; and exposing the substrate to a silicon precursor and to a phosphorus precursor, wherein the exposure of the substrate to the phosphorus precursor is done during an overlapping period with the exposure to the silicon precursor, thereby epitaxially growing the phosphorus doped silicon layer on the first surface, wherein:

(i) a temperature of the process chamber is at most 500° C. during the exposure of the substrate to the silicon precursor and to the phosphorus precursor, (ii) the silicon precursor comprises disilane introduced into the process chamber at a flow rate in a range of 50 sccm to 700 sccm, and (iii) the phosphorus precursor comprises phosphorus trichloride and phosphine co-flown together, the phosphorus trichloride is introduced into the process chamber at a flow rate in a range of 10 sccm to 500 sccm, and the phosphine is introduced into the process chamber at a flow rate in a range of 50 sccm to 900 sccm.

19. The method according to claim 18, wherein the substrate further comprises a second surface, wherein the phosphorus doped silicon layer is grown epitaxially and selectively on the first surface relative to the second surface, wherein the second surface is different than the first surface, and wherein the method further comprises:

exposing the substrate to chlorine gas as an etching gas in a nitrogen gas carrier thereby improving selectivity of phosphorus doped epitaxial silicon layer growth on the first surface relative to the second surface, wherein the chlorine gas is introduced into the process chamber at a flow rate in a range of 10 sccm to 200 sccm.

* * * * *